United States Patent
Cheng et al.

(10) Patent No.: US 9,818,940 B2
(45) Date of Patent: Nov. 14, 2017

(54) LARGE-SIZED AMOLED DISPLAY SUBSTRATE AND MANUFACTURING METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Leilei Cheng, Beijing (CN); Dongfang Wang, Beijing (CN); Yongchao Huang, Beijing (CN); Bin Zhou, Beijing (CN); Luke Ding, Beijing (CN); Min He, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/223,465

(22) Filed: Jul. 29, 2016

(65) Prior Publication Data
US 2017/0213975 A1 Jul. 27, 2017

(30) Foreign Application Priority Data
Jan. 25, 2016 (CN) .......................... 2016 1 0048621

(51) Int. Cl.
*H01L 51/00* (2006.01)
*H01L 27/32* (2006.01)
(Continued)

(52) U.S. Cl.
CPC ...... *H01L 51/0012* (2013.01); *H01L 27/3244* (2013.01); *H01L 51/0016* (2013.01);
(Continued)

(58) Field of Classification Search
None
See application file for complete search history.

(56) References Cited

U.S. PATENT DOCUMENTS

2007/0120468 A1* 5/2007 Lee .......................... H01L 51/56
313/504

FOREIGN PATENT DOCUMENTS

CN 101607714 B * 12/2010
CN 103466647 A * 12/2013
(Continued)

OTHER PUBLICATIONS

Roveri, N., G. Falini, E. Foresti, G. Fracasso, I.g. Lesci, and P. Sabatino. "Geoinspired Synthetic Chrysotile Nanotubes." Journal of Materials Research 21.11 (2006): 2711-725.*
(Continued)

*Primary Examiner* — Joseph Schoenholtz
(74) *Attorney, Agent, or Firm* — Armstrong Teasdale LLP

(57) ABSTRACT

A method for fabricating an Organic Light-Emitting Diode (OLED) display panel is provided. The method includes arranging Thin-Film Transistor (TFT) devices on one side of a substrate and a function layer on the other side of the substrate to form a laminate including both the TFT devices and the function layer, attaching the laminate onto a loading platform such that the function layer included in the laminate faces towards the loading platform, and conducting a process on the laminate to form an organic electroluminescent material layer on surfaces of the TFT devices.

17 Claims, 5 Drawing Sheets

(51) Int. Cl.
    *H01L 51/56* (2006.01)
    *H01L 51/52* (2006.01)
(52) U.S. Cl.
    CPC .......... *H01L 51/5253* (2013.01); *H01L 51/56* (2013.01); *H01L 2227/323* (2013.01)

(56) References Cited

FOREIGN PATENT DOCUMENTS

| CN | 103952665 A | 7/2014 | | |
|---|---|---|---|---|
| WO | WO 2011056403 A2 | * | 5/2011 | .............. H01M 4/13 |

OTHER PUBLICATIONS

Piperno, S., I. Kaplan-Ashiri, SR. Cohen, R. Popovitz-Biro, HD. Wagner, R. Tenne, E. Foresti, IG. Lesci, and N. Roveri. "Characterization of Geoinspired and Synthetic Chrysotile Nanotubes by Atomic Force Microscopy and Transmission Electron Microscopy." Advanced Functional Materials 17.16 (2007): 3332-338.*

Yu, Shaoming, Long Zhai, Yajun Wang, Xiguang Liu, Lianchi Xu, and Leilei Cheng. "Synthesis of Magnetic Chrysotile Nanotubes for Adsorption of Pb(II), Cd(II) and Cr(III) Ions from Aqueous Solution." Journal of Environmental Chemical Engineering 3.2 (2015): 752-62.*

* cited by examiner

A

B

LARGE-SIZED AMOLED DISPLAY SUBSTRATE AND MANUFACTURING METHOD THEREOF

CROSS-REFERENCE TO RELATED APPLICATION

This application claims priority to Chinese Patent Application No. 201610048621.6, which was filed on Jan. 25, 2016, the disclosure of which is incorporated herein by reference in its entirety.

BACKGROUND

The present disclosure relates to the field of an Organic Light-Emitting Diode (OLED) display panel and a method for fabricating the same, and particularly to an evaporating method and process for organic electroluminescent devices.

An Organic Light-Emitting Diode (OLED) is also referred to as an organic electroluminescent display device, which is characterized in self-lighting. As a result, OLED display panels are widely applied in the market, due to a wider view angle and less power consumption than before. As OLED is prevailing and on high demand, stricter requirements are imposed on the processes for fabricating the OLED.

In particular, large-scale Active-Matrix Organic Light-Emitting Diode (AMOLED) products (for example, TVs) achieve self-lighting depending on an interaction between white light and a color filter. Therefore only Open Mask evaporating method is suitable for such self-lighting. In the meantime, according to characteristics of the evaporating process, an evaporating device with In-Line arrangement is generally adopted for the sake of cost reduction.

It is necessary to have a substrate and its mask attached together, such that they may be conveyed along to complete the evaporation process, during the evaporation process on the organic electroluminescent material layer of the AMO-LED display panel due to characteristics of the In-Line device. However, such a large-scale display panel may result in that bending or other deforms easily happen in the course of attachment and conveyance of a glass substrate, which leads to adverse effect on the evaporation process. Accordingly, counter measures for overcoming all defects due to bending or other deforms of the large-scale AMOLED display panel in the course of its attachment and conveyance need to be proposed urgently.

BRIEF DESCRIPTION

The present disclosure provides in some embodiments an Organic Light-Emitting Diode (OLED) display panel and a method for fabricating the same, such that process yields and production efficiency can be improved, adverse effect on the Thin-Film Transistor (TFT) circuits and the OLED display panel due to electricity discharge from the accumulated static electricity can be reduced, and performance of the OLED display panel can be improved.

In a first aspect, embodiments of the present disclosure provide a method for fabricating an OLED display panel. The method includes arranging TFT devices 101 on one side of a substrate 100 and a function layer 102 on the other side of the substrate, so as to form a laminate including both the TFT devices 101 and the function layer 102, attaching the laminate onto a loading platform 103 where the function layer 102 included in the laminate faces towards the loading platform 103, and conducting a process (for example, an evaporation process) on the laminate that is attached to the loading platform 103 (for example, by an In-Line device located in the evaporation device), so as to form an organic electroluminescent material layer 104 on surfaces of the TFT devices 101.

In one possible embodiment, the fabricating method includes encapsulating the organic electroluminescent material layer 104 on the encapsulation platform 105, so as to form a protection layer 106, and removing the encapsulation platform 105 to form the OLED display panel.

In one possible embodiment, the function layer includes a magnetic material.

In one possible embodiment, the method includes arranging at least one electromagnetic module device on the loading platform, so as to control attraction and alignment of the electromagnetic module device with respect to the laminate by controlling electrical current magnitude.

In one possible embodiment, the OLED display panel is an Active-Matrix Organic Light Emitting Diode (AMO-LED) display panel, and the substrate is made of any suitable materials, such as at least one of glass, polyimide, and epoxy resin.

In one possible embodiment, the step of forming the function layer includes steps of forming a siloxane material layer, and forming a patterned nano magnetic inorganic material on the resultant siloxane material layer.

In one possible embodiment, the step of forming the siloxane material layer includes a step of forming the siloxane material layer, and forming a patterned nano magnetic inorganic material on the resultant siloxane material layer.

In one possible embodiment, the step of forming the siloxane material layer includes a step of forming the siloxane material layer 1021 on the other side of the substrate by a coating process, and the step of forming the patterned nano magnetic inorganic material includes steps of dispersing magnetic chrysotile nanotube material 1022 into a solvent, and forming the patterned magnetic chrysotile nanotube material on the siloxane material layer 1021 by a solution process, wherein the method further includes a step of conducting a low-temperature curing process on the siloxane material layer 1021, so as to form the function layer 102.

In one possible embodiment, the siloxane material layer is made of at least one of organomodified polydimethyl siloxane and polydimethylsiloxane.

In one possible embodiment, the solvent is at least one of ethanol solution and water.

It should be appreciated that the above patterning process may be chosen from any conventional patterning processes, which is not limited herein.

In one possible embodiment, the method further includes forming an inorganic silicon thin film on surfaces of the function layer.

In one possible embodiment, the step of forming the inorganic silicon thin film includes steps of performing a first oxidation process on the function layer 102 by using ultraviolet or ozone, after forming the function layer, and curing the resultant function layer after the first oxidation process, so as to obtain an insulation layer, thereby improving mechanical strength of the function layer.

In one possible embodiment, a time period for performing the first oxidation process ranges from about 15 seconds to about 2 minutes. The inorganic silicon thin film includes $SiO_2$ formed at surfaces of Polydimethylsiloxane (PDMS) materials where incident light rays enter.

In one possible embodiment, the method further includes removing the function layer, so as to reduce attachment strength between the function layer and the substrate.

In one possible embodiment, the step of removing the function layer includes a step of performing a second oxidation process on the function layer 102, so as to reduce attachment strength between the function layer and the substrate, thereby removing the function layer from the substrate; and wherein a time period for performing the second oxidation process ranges from about 15 seconds to about 2 minutes.

In a second aspect, embodiments of the present disclosure provide an OLED display panel obtained by any one of the above methods.

In one possible embodiment, the OLED display panel includes a substrate, Thin-Film Transistor (TFT) devices arranged on one side of the substrate, an organic light-emitting layer arranged on the TFT devices, and a function layer arranged on the other side of the substrate.

In one possible embodiment, the function layer includes a magnetic material.

In one possible embodiment, the magnetic material includes nano magnetic inorganic substance.

In one possible embodiment, the nano magnetic inorganic substance includes magnetic chrysotile nanotubes.

In one possible embodiment, the function layer further includes a siloxane material.

In one possible embodiment, the function layer further includes an inorganic silicon material.

In one possible embodiment, the OLED display panel is an Active-Matrix Organic Light Emitting Diode (AMOLED) display panel.

According to embodiments of the present disclosure, the substrate is provided with a magnetic material (for example, nano magnetic inorganic substance) on its back surface by a solution process, which enables the substrate magnetic, thereby improving an attachment between a large-scale OLED display panel and its Mask as well as yields. Further, by improving the patterning design of the magnetic material (for example, nano magnetic inorganic substance) on the substrate and minimizing static electricity produced in the course of fabricating the substrate, adverse effect on TFT circuits and the OLED display panel due to static electricity accumulation discharge can be greatly mitigated.

BRIEF DESCRIPTION OF THE DRAWINGS

In order to illustrate the technical solutions of the present disclosure or the related art in a more apparent manner, the drawings desired for the embodiments of the present disclosure will be described briefly hereinafter. Obviously, the following drawings merely relate to some embodiments of the present disclosure, and based on these drawings, a person skilled in the art may obtain the other drawings without any creative effort.

Figure 1A:
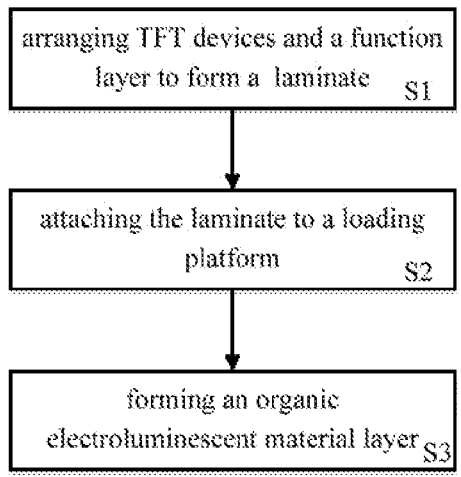
FIGS. 1A and 1B are flow charts illustrating a method for fabricating an Organic Light-Emitting Diode (OLED) display panel according to certain embodiments of the present disclosure.

In the Figures, different reference numbers represent the following elements or parts, specifically: 100 substrate; 101 TFT device; 102 function layer; 1021 siloxane material layer; 1022 magnetic chrysotile nanotube material; 1021S inorganic silicon thin film; 103 loading platform; 104 organic electroluminescent material layer; 105 encapsulation platform; 106 encapsulation protection layer.

DETAILED DESCRIPTION

The following embodiments are only used to describe the present disclosure, not used to impose any limitations thereto.

In order to make the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance.

For purposes of the description hereinafter, the terms "upper", "lower", "right", "left", "vertical", "horizontal", "top", "bottom", and derivatives thereof shall relate to the embodiments, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

The present disclosure provides in some embodiments a method for fabricating an Organic Light-Emitting Diode (OLED) display panel. Here, the OLED display panel may be an Active-Matrix Organic Light Emitting Diode (AMOLED) display panel.

FIG. 1A is a flow chart illustrating a method for fabricating the OLED display panel according to one embodiment of the present disclosure. As shown in FIG. 1A, the fabricating method according to this embodiment of the present disclosure may include the following steps: S1, arranging Thin-Film Transistor (TFT) devices on one side of a substrate and a function layer on the other side of the substrate opposite to the side where the TFT devices are arranged, so as to form a laminate including both the TFT devices and the function layer; S2, attaching the laminate onto a loading platform where the function layer included in the laminate faces towards the loading platform; and S3, conducting a process on the laminate that is attached to the loading platform, so as to form an organic electroluminescent material on surfaces of the TFT devices.

In one possible embodiment, the function layer includes a magnetic material. Specifically, the function layer includes nano magnetic inorganic substance, for example, magnetic chrysotile nanotubes.

Figure 1B:
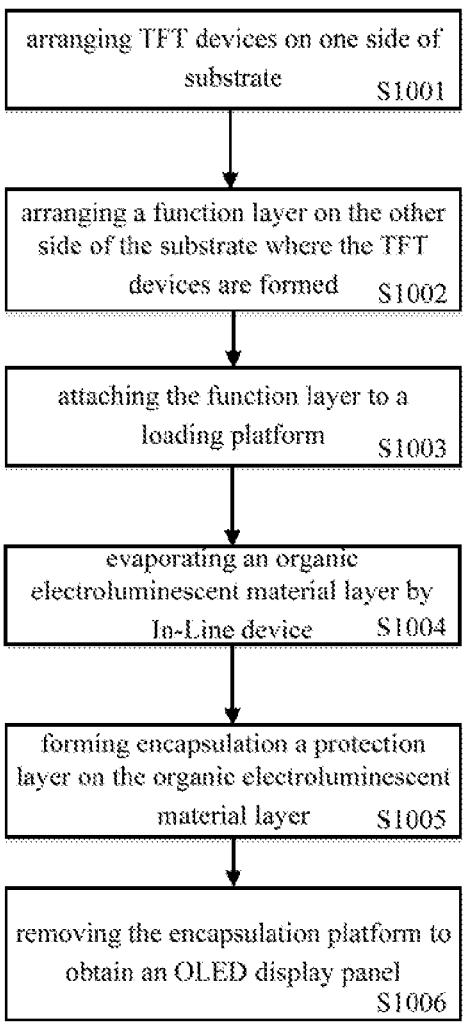
Figure 4:
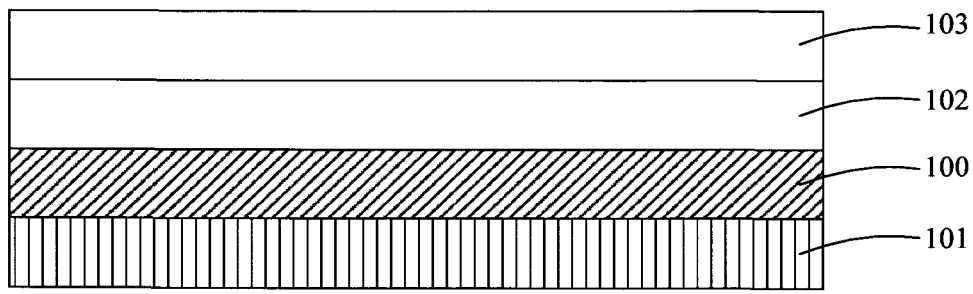
Figure 5:
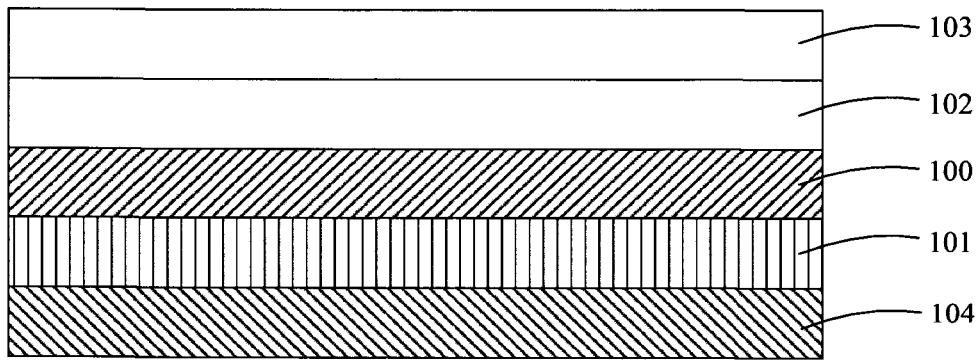
Figure 6:
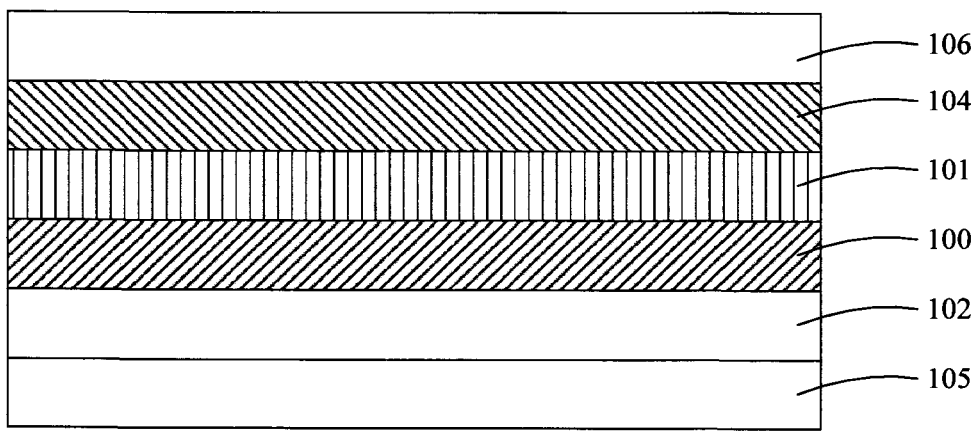
Figure 7:
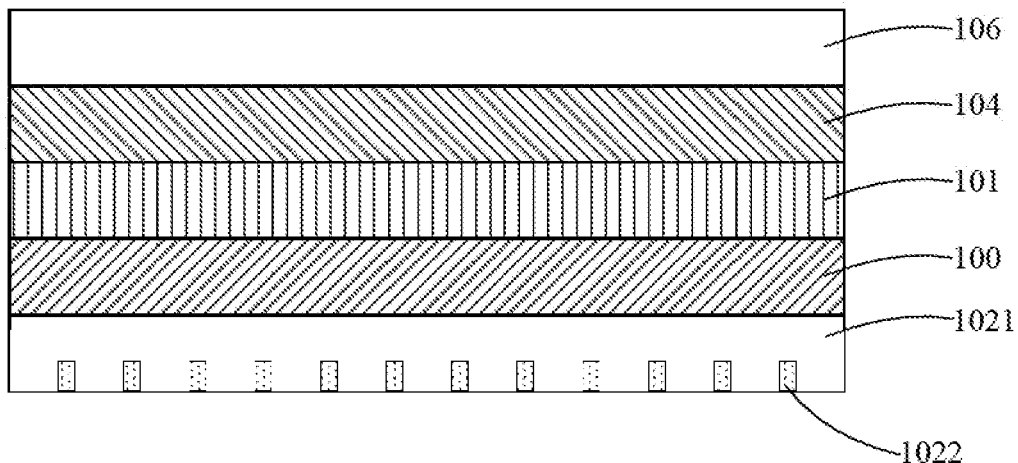

Specifically, as shown in FIG. 1B, in one possible embodiment, the method for fabricating the OLED display panel may include the following steps: S1001, arranging TFT devices 101 on the upper surface of a substrate 100 (i.e., the surface far away from the loading platform in subsequent processes); S1002, arranging a function layer on the lower surface of the substrate 100 (i.e., the surface facing towards the loading platform in the subsequent processes); S1003, attaching the function layer 102 included in the laminate onto the loading platform 103, as shown in FIG. 4, after forming the laminate including both the TFT devices 101 and the function layer 102 subsequent to S1001 and S1002; S1004, conveying the laminate attached to the loading platform 103 to go through an In-Line device within the evaporation device, and evaporating the laminate accordingly, so as to form an organic electroluminescent material layer 104 on surfaces of the TFT devices 101, as shown in FIG. 5, after the evaporation process; S1005, encapsulating the organic electroluminescent material layer 104 on the encapsulation platform 105, so as to form a protection layer 106, as shown in FIG. 6; and S1006, removing the encapsulation platform 105 to obtain the OLED display panel, as shown in FIG. 7.

According to embodiments of the present disclosure, the substrate is provided with a function layer 102 on its back surface (i.e., the surface facing towards the loading platform in subsequent processes), which enables the substrate magnetic, thereby improving an attachment between an OLED display panel (in particular, a large-scale AMOLED display panel) and its Mask as well as yields. Further, by minimizing static electricity produced in the course of fabricating the substrate, adverse effect on TFT circuits and the OLED display panel due to static electricity accumulation discharge can be greatly mitigated.

Here, the substrate may be made of any conventional substrate materials in the art, such as at least one of glass, polyimide, and epoxy resin, or any other suitable materials.

For the purpose of overcoming all defects due to bending or other deforms of the OLED display panel (in particular, the large-scale AMOLED display panel) in the course of its attachment and conveyance, a substrate is provided with a magnetic function layer at its back surface according to embodiments of the present disclosure, thereby enabling the substrate magnetic and prevent the substrate from any deforms in the course of its attachment and conveyance.

Specifically, the step of forming the function layer includes steps of forming a siloxane material layer; and forming a patterned nano magnetic inorganic material on the resultant siloxane material layer.

Figure 2A:
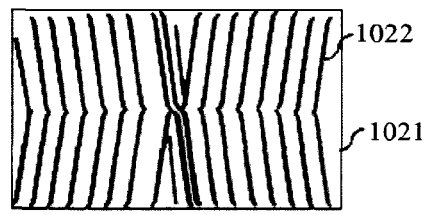
FIG. 2A is a diagram illustrating one possible pattern of a function layer of the OLED display panel according to a certain embodiment of the present disclosure.
Figure 2B:
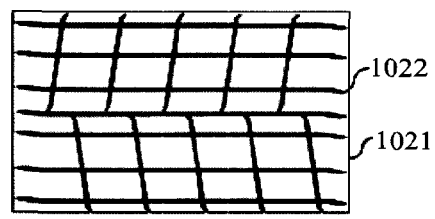
FIG. 2B is a diagram illustrating another possible pattern of the function layer of the OLED display panel according to another certain embodiment of the present disclosure.

Specifically, the step of forming the siloxane material layer includes a step of forming the siloxane material layer 1021 on the lower surface of the substrate (i.e., another side of the substrate opposite to the side where TFT devices are arranged) by a coating process (for example, a spin coating process). Further, the step of forming the patterned nano magnetic inorganic material includes steps of dispersing magnetic chrysotile nanotube material 1022 into a solvent, and forming the patterned magnetic chrysotile nanotube material on the siloxane material layer 1021 by a solution process, as shown in FIGS. 2A and 2B. In addition, the method may further include a step of conducting a low-temperature curing process on the siloxane material layer 1021, so as to form the function layer 102.

Here, the siloxane material layer is made of at least one of organomodified polydimethyl siloxane and polydimethylsiloxane, or any other suitable materials.

Further, the solvent is at least one of ethanol solution and water. And the resultant patterns are shown in FIGS. 2A and 2B.

Figure 3:
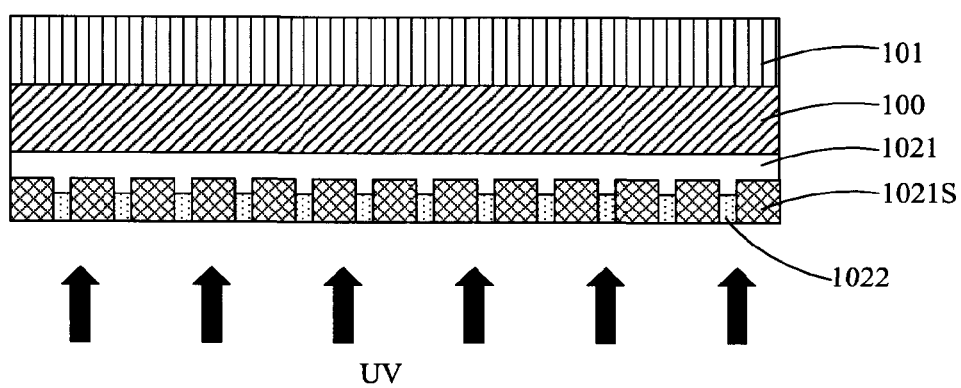
FIGS. 3-10 are diagrams illustrating structures of the OLED display panel after respective steps according to embodiments of the present disclosure.

An oxidation process (i.e., a first oxidation process) may be performed on the function layer 102 by using ultraviolet or ozone, after the function layer is formed. As shown in FIG. 3, an inorganic silicon thin film 1021S is formed on a surface of the function layer 102 by a curing process, so as to form an insulation layer. The main role played by the curing process is to cure the outer inorganic silicon thin film, such that hardness of the inner siloxane material can be enhanced, thereby achieving a more stable attachment between the OLED display panel and its Mask and not vulnerable to bending or other deforms. As a result, the yields can be improved in terms of the evaporation process. The thickness of the inorganic silicon thin film layer depends on time duration of the oxidation process. Within this embodiment of the present disclosure, a time period for performing the oxidation process ranges from about 15 seconds to about 2 minutes, to ensure that the hardness of the inorganic silicon thin film material is slightly higher than that of the siloxane material.

The resultant OLED display panel is attached onto a loading platform that is provided with at least one electromagnetic module device. Due to an electromagnetic attraction force between the loading platform 103 provided with the electromagnetic module device and the OLED display panel provided with the function layer, it is conducive to fabricating an encapsulation protection layer 106 in the course of a metal encapsulation process as well as polymer film layer alignment and encapsulation processes, so as to control attraction and alignment of the electromagnetic module device with respect to the laminate by controlling electrical current magnitude. As a result, the substrate is more stable when being attached to its Mask than conventional and not vulnerable to bending or other deforms, thereby improving the yields in terms of the evaporation process.

Figure 8:
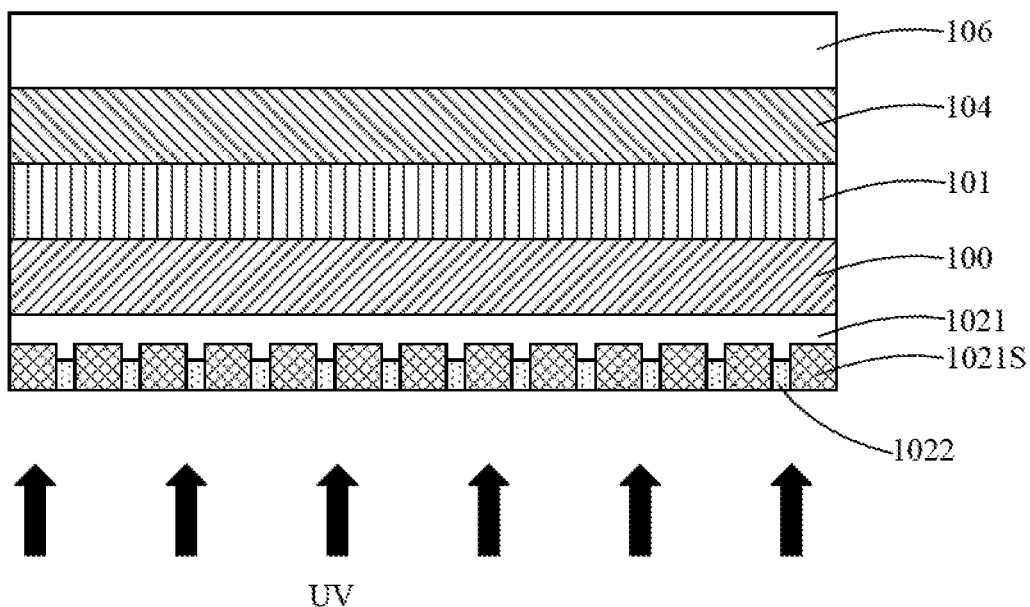
Figure 9:
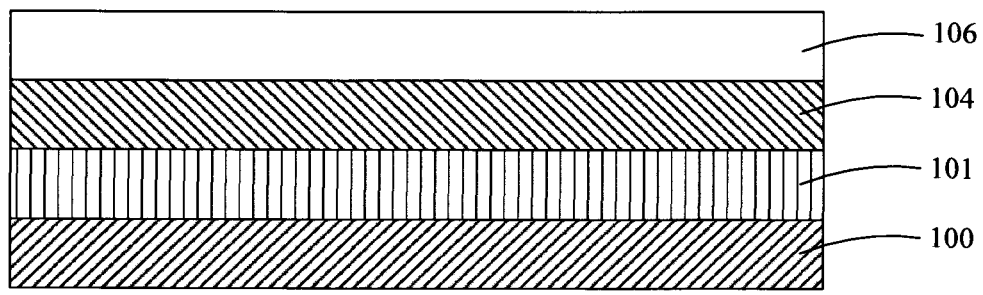

In another situation where the above function layer is not needed according to specific manufacturing requirements, a further oxidation process (i.e., a second oxidation process) may be performed on the function layer 102 from the bottom side of the substrate. As shown in FIG. 8, a further oxidation process is performed on remaining siloxane material layer 1021 to form an inorganic silicon thin film 1021S, such that the attachment strength between the function layer and the substrate can be reduced to some extent. As a result, the function layer 102 may be removed (peeled off) from the substrate, as shown in FIG. 9. Here, a time period for performing the further oxidation process also ranges from about 15 seconds to about 2 minutes.

According to embodiments of the present disclosure, the substrate is provided with a nano magnetic inorganic substance on its back surface, which enables the substrate magnetic, thereby improving an attachment between a large-scale OLED display panel and its Mask as well as yields. Further, by improving the patterning design of the nano magnetic inorganic substance on the substrate and minimizing static electricity produced in the course of fabricating the substrate, adverse effect on TFT circuits and the OLED display panel due to static electricity accumulation discharge can be greatly mitigated. As a result, the resultant OLED display panel can have better yields and more stable performances.

A first embodiment of a method for fabricating an OLED display panel (having a function layer 102) will be explained next. The method may include the following steps: S1, arranging TFT devices 101 on one side of a substrate 100 (which may include glass or other suitable materials); S2, arranging a function layer 102 on the other side of the substrate 100 opposite to the side where TFT devices 101 are arranged; S3, attaching a laminate including the TFT devices 101 and the function layer 102 onto the loading platform 103, as shown in FIG. 4, the loading platform 103 being provided with at least one electromagnetic module device (the number of the electromagnetic module devices depends on practical needs), so as to control attraction and alignment of the electromagnetic module device with respect to the laminate by controlling electrical current magnitude; S4, evaporating an organic electroluminescent material layer 104 by conveying the laminate attached to the loading platform 103 to go through an In-Line device within an evaporation device, as shown in FIG. 5; S5, encapsulating the organic electroluminescent material layer 104 on the encapsulation platform 105, so as to complete the preparation of an encapsulation protection layer 106, due to the fact that a magnetic force between the encapsulation platform 105 provided with the electromagnetic module device and the substrate after the evaporation process may be applied to processes such as a metal encapsulation process or polymer film layer alignment and encapsulation processes; and S6, completing the OLED display panel as shown in FIG. 7.

Specifically, step S2, namely the step of forming the function layer may include forming the siloxane material layer 1021 on the lower surface of the substrate (i.e., the other side of the substrate opposite to the side where TFT devices are arranged) by a coating process (for example, a spin coating process), dispersing magnetic chrysotile nanotube material 1022 into a solvent, and forming the patterned magnetic chrysotile nanotube material on the siloxane material layer 1021 by a solution process, as shown in FIGS. 2A and 2B. In addition, this step may further include a step of conducting a low-temperature curing process on the siloxane material layer 1021, so as to form the function layer 102.

Further, as shown in FIG. 3, an oxidation process (i.e., a first oxidation process) may be performed on the function layer 102 by using ultraviolet or ozone for a time period ranging from about 15 seconds to about 2 minutes, so as to form a $SiO_2$ film layer 1021S that is slightly harder than a polydimethylsiloxane material layer 1021 on a surface of the polydimethylsiloxane material layer, thereby improving its mechanical strength of the function layer 102.

A second embodiment of another method for fabricating an OLED display panel (free of a function layer) will be explained next. The method may include the following steps: S1-S5, which are the same as those in the first embodiment; S6, performing a further oxidation process (i.e., a second oxidation process) on the function layer 102 from the bottom of the substrate by using ultraviolet light rays, so as to oxidize remaining polydimethylsiloxane material layer 1021 to form the $SiO_2$ film layer 1021S, such that the attachment strength between the function layer 102 and the substrate 100 can be reduced to some extent, thereby removing (peeling off) easily the function layer 102 from the substrate 100 of the OLED display panel, as shown in FIG. 8; and S7, forming the OLED display panel including the substrate, the TFT devices, the organic electroluminescent material layer, and the encapsulation protection layer, as shown in FIG. 9.

In addition, the present disclosure provides in some embodiments an OLED display panel. The OLED display panel includes a substrate, TFT devices arranged on one side of the substrate, an organic light-emitting layer arranged on the TFT devices, and a function layer arranged on the other side of the substrate opposite to the side where the TFT devices are arranged.

Figure 10:
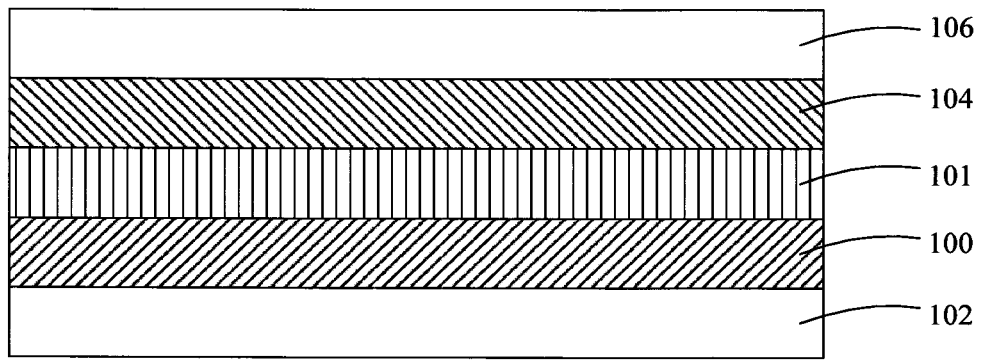

Specifically, in one possible embodiment, a structure of the OLED display panel is shown in FIG. 10. It is clearly shown in FIG. 10 that the OLED display panel includes a function layer 102, a substrate 100 on the function layer 102, TFT devices on the substrate 100, an organic electroluminescent layer 104 on the TFT devices 101, and a protection layer 106 on the organic electroluminescent layer 104.

The above are merely example embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A method for fabricating an Organic Light-Emitting Diode (OLED) display panel, the method comprising:
    arranging Thin-Film Transistor (TFT) devices on one side of a substrate and a function layer on the other side of the substrate to form a laminate including both the TFT devices and the function layer, wherein the function layer includes a magnetic material that includes a nano magnetic inorganic substance;
    attaching the laminate onto a loading platform such that the function layer included in the laminate faces towards the loading platform; and
    conducting a process on the laminate to form an organic electroluminescent material layer on surfaces of the TFT devices.

2. The method according to claim 1, further comprising: arranging at least one electromagnetic module device on the loading platform to control attraction and alignment of the electromagnetic module device with respect to the laminate by controlling electrical current magnitude.

3. The method according to claim 1, wherein the OLED display panel is an Active-Matrix Organic Light Emitting Diode (AMOLED) display panel, and wherein the substrate is made of at least one of glass, polyimide, and epoxy resin.

4. The method according to claim 1, wherein forming the function layer includes:
    forming a siloxane material layer; and
    forming a patterned nano magnetic inorganic material on the resultant siloxane material layer.

5. The method according to claim 4, wherein forming the siloxane material layer includes forming the siloxane material layer on the other side of the substrate by a coating process, wherein forming the patterned nano magnetic inorganic material includes dispersing a magnetic chrysotile nanotube material into a solvent and forming the patterned magnetic chrysotile nanotube material on the siloxane material layer by a solution process, and wherein the method further conducting a low-temperature curing process on the siloxane material layer to form the function layer.

6. The method according to claim 4, wherein the siloxane material layer is made of at least one of organomodified polydimethyl siloxane and polydimethylsiloxane.

7. The method according to claim 5, wherein the solvent is at least one of ethanol solution and water.

8. The method according to claim 4, further comprising forming an inorganic silicon thin film on surfaces of the function layer.

9. The method according to claim 8, wherein forming the inorganic silicon thin film includes:
performing a first oxidation process on the function layer using ultraviolet or ozone; and
curing the resultant function layer after the first oxidation process.

10. The method according to claim 9, wherein a time period for performing the first oxidation process ranges from about 15 seconds to about 2 minutes.

11. The method according to claim 4, further comprising removing the function layer.

12. The method according to claim 11, wherein removing the function layer comprises performing a second oxidation process on the function layer to reduce attachment strength between the function layer and the substrate, thereby removing the function layer from the substrate, wherein a time period for performing the second oxidation process ranges from about 15 seconds to about 2 minutes.

13. An Organic Light-Emitting Diode (OLED) display panel comprising:
a substrate;
Thin-Film Transistor (TFT) devices arranged on one side of the substrate;
an organic light-emitting layer arranged on the TFT devices; and
a function layer arranged on the other side of the substrate, wherein the function layer includes a magnetic material that includes a nano magnetic inorganic substance.

14. The OLED display panel according to claim 13, wherein the nano magnetic inorganic substance includes magnetic chrysotile nanotubes.

15. The OLED display panel according to claim 13, wherein the function layer further includes a siloxane material.

16. The OLED display panel according to claim 14, wherein the function layer further includes an inorganic silicon material.

17. The OLED display panel according to claim 13, wherein the OLED display panel is an Active-Matrix Organic Light Emitting Diode (AMOLED) display panel.

* * * * *